(12) United States Patent
Borkenhagen et al.

(10) Patent No.: US 7,802,158 B2
(45) Date of Patent: *Sep. 21, 2010

(54) DIAGNOSTIC INTERFACE ARCHITECTURE FOR MEMORY DEVICE

(75) Inventors: John Michael Borkenhagen, Rochester, MN (US); William Paul Hovis, Rochester, MN (US); James Anthony Marcella, Rochester, MN (US); Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/409,009

(22) Filed: Mar. 23, 2009

(65) Prior Publication Data

US 2009/0183039 A1 Jul. 16, 2009

Related U.S. Application Data

(63) Continuation of application No. 10/955,735, filed on Sep. 30, 2004, now Pat. No. 7,526,692.

(51) Int. Cl.
*G01R 31/28* (2006.01)
(52) U.S. Cl. ............... 714/724; 714/726; 714/763; 714/799
(58) Field of Classification Search ........... 714/724, 714/718, 726, 727, 736, 746, 763, 769, 799
See application file for complete search history.

(56) References Cited

U.S. PATENT DOCUMENTS

| | | | |
|---|---|---|---|
| 4,357,703 A | 11/1982 | Van Brunt | |
| 5,068,851 A | 11/1991 | Bruckert et al. | |
| 5,124,987 A * | 6/1992 | Milligan et al. | 714/7 |
| 5,430,855 A * | 7/1995 | Walsh et al. | 710/10 |
| 6,493,647 B1 | 12/2002 | Chiang et al. | |
| 6,675,335 B1 | 1/2004 | Chiang et al. | |
| 6,681,359 B1 | 1/2004 | Au et al. | |
| 6,701,474 B2 | 3/2004 | Cooke et al. | |

\* cited by examiner

*Primary Examiner*—Fritz Alphonse
(74) *Attorney, Agent, or Firm*—Wood, Herron & Evans, LLP

(57) ABSTRACT

A diagnostic interface architecture for a memory device supports in one aspect one or more dynamically reconfigurable functional interconnects normally utilized in connection with reading data from the memory device and/or writing data to the memory device. The dynamically reconfigurable functional interconnects are capable of being configured to operate in either functional or diagnostic modes, whereby in the diagnostic mode, such interconnects may be used to communicate diagnostic information to support one or more diagnostic operations. The diagnostic interface architecture may also support multiple diagnostic interfaces in a given memory device, with at least one such diagnostic interface being capable of being selectively enabled in response to a failure in another diagnostic interface.

20 Claims, 4 Drawing Sheets

DIAGNOSTIC INTERFACE ARCHITECTURE FOR MEMORY DEVICE

CROSS-REFERENCE TO RELATED APPLICATIONS

This application is a continuation of U.S. patent application Ser. No. 10/955,735 U.S. Pat. No. 7,526,692, filed on Sep. 30, 2004 by John Michael Borkenhagen et al., the entire disclosure of which is incorporated by reference herein.

FIELD OF THE INVENTION

The invention relates to computers and data processing systems, and in particular to performing diagnostic testing in memory devices utilized in such computers and data processing systems.

BACKGROUND OF THE INVENTION

Ensuring the integrity of data processed by a data processing system such as a computer or like electronic device is critical for the reliable operation of such a system. Data integrity is of particular concern, for example, in fault tolerant applications such as servers, databases, scientific computers, and the like, where any errors whatsoever could jeopardize the accuracy of complex operations and/or cause system crashes that affect large numbers of users.

Data integrity issues are a concern, for example, for many solid state memory arrays such as those used as the main working storage repository for a data processing system. Solid state memory arrays are typically implemented using multiple integrated circuit memory devices such as static or dynamic random access memory (SRAM or DRAM) devices, and are controlled via memory controllers typically disposed on separate integrated circuit devices and coupled thereto via a memory bus.

A significant amount of effort has been directed toward detecting and correcting errors in memory devices during power up of a data processing system, as well as during the normal operation of such a system. It is desirable, for example, to enable a data processing system to, whenever possible, correct any detected problems automatically, without requiring a system administrator or other user to manually perform any repairs. It is also desirable for any such corrections to be performed in such a fashion that the system remains up and running. Often such characteristics are expensive and only available on complex, high performance data processing systems. Furthermore, in many instances, many types of errors go beyond the ability of a conventional system to do anything other than "crash" and require a physical repair before normal device operation can be restored.

One such type of error that has traditionally presented difficulties in conventional data processing systems is a failure in the interface of a memory device. In many DRAM memory devices, for example, when a memory device is powered up, a certain sequence of events is expected and required for appropriate operation. Typically, once power is applied, clocks are applied, followed by initialization, and then initiation of a periodic refresh operation. However, if some portion of the interface for the memory device is broken (e.g., due to a bad clock input, a bad address or command input, etc.), it may not be possible to complete this sequence of events.

Many integrated circuit devices or chips support a test scan interface, as well as on-board Built-In Self-Test (BIST) logic, that assist in diagnosing, and sometimes correcting, errors in a device. One widely used test scan interface is the Joint Test Action Group (JTAG) test scan interface, which relies on a set of five signals to communicate diagnostic data to or from an integrated circuit device. On-board scan registers are architected into the integrated circuit device to either insert or capture data at various internal nodes in a circuit. Arrays may be tested using Array BIST (ABIST) circuitry, while logic circuitry may be tested using Logical BIST (LBIST) circuitry, with both types of circuitry capable of being interfaced with a JTAG interface for communication with an external device.

Conventional JTAG interfaces, however, require a set of dedicated interconnects (i.e., pins, contact pads, balls, etc.) on an integrated circuit device. On many integrated circuit devices, the addition of a set of JTAG interconnects does not present a problem. However, for many devices, particularly most memory devices, there is a strong reluctance to increase the number of interconnects beyond those required for the functional interfaces for the devices, often due to extremely tight cost concerns. Existing memory device standards, including, for example, SDRAM standards such as DDR, DDR2, and FB-DIMM, do not support any dedicated JTAG or other diagnostic interconnects.

As such, conventional memory devices have not provided support for JTAG or other diagnostic interfaces, and thus remain extremely susceptible to certain types of errors such as memory interface errors on the devices that inhibit communication with a memory controller. Furthermore, given cost constraints, it is unlikely that dedicated diagnostic interfaces would be acceptable to most memory device standards bodies. A significant need has therefore arisen for a manner of providing a diagnostic interface on a memory device in a cost effective, reliable and acceptable manner.

SUMMARY OF THE INVENTION

The invention addresses these and other problems associated with the prior art by utilizing a unique diagnostic interface architecture for a memory device that supports diagnostic operations to be performed on the memory device to facilitate error detection and/or correction in a data processing system incorporating such a memory device.

In one aspect, a diagnostic interface architecture consistent with the invention may utilize one or more dynamically reconfigurable functional interconnects normally utilized in connection with reading data from the memory device and/or writing data to the memory device. The dynamically reconfigurable functional interconnects are capable of being configured to operate in either functional or diagnostic modes, whereby in the functional mode such interconnects may be used to communicate functional information used in reading data from and/or writing data to the memory device, and in the diagnostic mode, such interconnects may be used to communicate diagnostic information to support one or more diagnostic operations. Among other benefits, by utilizing dynamically reconfigurable functional interconnects, diagnostic functionality may be supported in a memory device without the need for additional dedicated interconnects.

In another aspect a diagnostic interface architecture consistent with the invention may utilize multiple diagnostic interfaces on a given memory device, with at least one such diagnostic interface being capable of being selectively enabled in response to a failure in another diagnostic interface. By doing so, greater protection is provided against a failure in a diagnostic interface itself that would otherwise inhibit the initiation of diagnostic operations in a memory device.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Figure 1:
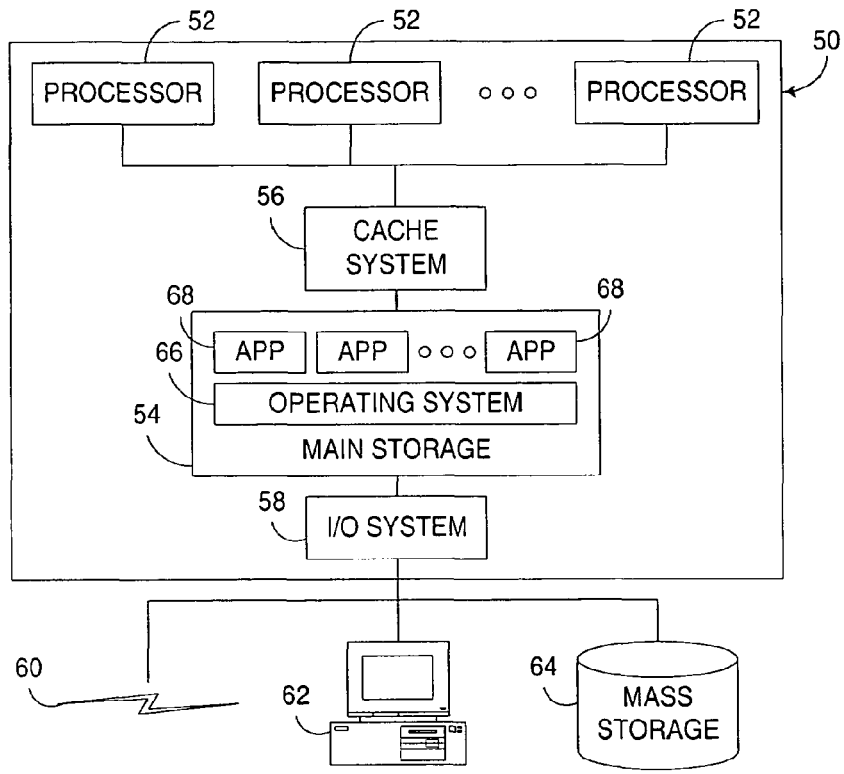
FIG. 1 is a block diagram of an exemplary apparatus with a memory architecture supporting a diagnostic interface consistent with the invention.

The embodiments discussed and illustrated hereinafter utilize a unique diagnostic interface architecture for memory devices to facilitate the diagnosis of failures in the memory devices and/or the interfaces to which such memory devices are connected.

Embodiments discussed hereinafter utilize dynamically reconfigurable functional interconnects in the electrical interface for a memory device or in a memory subsystem that are capable of operating in multiple modes, one of which being a functional mode whereby normal control, data and/or address information may be communicated over the interconnects, and another of which being a diagnostic mode whereby diagnostic information may be communicated over the interconnects in lieu of the normal control, data and/or address information. Typically, when in a diagnostic mode, the interconnects are dedicated to communicating diagnostic information, and thus are disabled for communicating other types of information such as functional information.

As such, some embodiments consistent with the invention are capable of supporting a diagnostic interface on a memory device without requiring any additional interconnects, and thus with reduced impact on the cost, size and packaging of a memory device.

A functional interconnect, in this regard, refers to an electrically conductive element in a memory device or subsystem that is normally used to communicate functional information in the normal operation of the memory device or subsystem. Such an interconnect may be, for example, implemented as a "pin", "ball" or other contact element on an integrated circuit device or chip, or in the alternative, may simply be a conductive signal path or terminal (the latter of which being typical, for example, when the functional interconnect is used to communicate between two components integrated onto the same chip).

Functional information that may be communicated over a functional interconnect may include practically any type of information that is communicated to or from a memory device or subsystem during normal memory system operation, e.g., address signals, data signals, command signals, control signals, clock signals, strobe signals, chip enable signals, bank address signals, mask signals, ,etc. In addition, the types of diagnostic information that may be communicated over a dynamically reconfigurable functional interconnect may include diagnostic-related command signals, control signals, data signals, address signals, result signals, clock signals, etc. For example, in one embodiment consistent with the invention, the diagnostic information communicated over a set of dynamically reconfigurable functional interconnects may implement a test scan interface such as a JTAG interface, the configuration and use of which is well known to those of ordinary skill in the art. It will be appreciated, however, that other diagnostic information, as well as other diagnostic protocols and functionality, may be supported consistent with the invention.

As will become more apparent below, another feature that may be supported in a diagnostic interface architecture consistent with the invention is the use of multiple diagnostic interfaces for a given memory device or memory subsystem. Through the use of multiple interfaces, the likelihood increases that a memory device will be capable of being communicated with for all but the most highly catastrophic and unlikely events, such as having multiple bad interconnects, severe shorts, no power, insufficient power levels, etc.

Multiple diagnostic interfaces may be supported, for example, in a master/slave fashion with one interface being active by default. In a JTAG-based implementation, for example, it may be desirable to use TCK running on one diagnostic interface to lock out any alternate interfaces from ever activating. It may also be desirable for an alternate diagnostic interface to only be activated if TCK from the master interface is inactive and the alternate TCK becomes active. Other manners of controlling the activation of different diagnostic interfaces, as well as other manners of triggering the activation or deactivation of particular interfaces will be apparent to one of ordinary skill having the benefit of the instant disclosure.

It will also be appreciated that each diagnostic interface may incorporate only dynamically reconfigurable functional interconnects, only dedicated diagnostic interconnects, or a mixture of dynamically reconfigurable functional interconnects and dedicated diagnostic interconnects.

Furthermore, it will be appreciated that the principles of the invention may also have benefit for use in connection with logic devices other than memory devices, where it is desirable to communicate diagnostic information over a functional interface when properly configured in a diagnostic mode, and thus eliminate the need for a separate, dedicated diagnostic interface. Illustrative logic devices include, for example, processor devices, controller devices, and practically any other device capable of communicating with other devices over a functional interface.

Turning to the Drawings, wherein like numbers denote like parts throughout the several views, FIG. 1 illustrates a computer 50 that represents one suitable environment within which the herein-described memory device diagnostic interfaces may be implemented in a manner consistent with the invention. Computer 50 generically represents, for example, any of a number of multi-user computers such as a network server, a midrange computer, a mainframe computer, etc. However, it should be appreciated that the invention may be implemented in practically any device capable of utilizing solid state memory devices, including other computers and data processing systems, e.g., in single-user computers such as workstations, desktop computers, portable computers, and the like, or in other programmable electronic devices (e.g., incorporating embedded controllers and the like), such as set top boxes, game machines, etc.

Computer 50 generally includes one or more processors 52 coupled to a main storage 54 through one or more levels of cache memory disposed within a cache system 56. In some embodiments each processor 52 may include multiple processing cores. Furthermore, main storage 54 is coupled to a number of types of external devices via a system input/output (I/O) system 58, e.g., one or more networks 60, one or more workstations 62 and one or more mass storage devices 64. Any number of alternate computer architectures may be used in the alternative.

Also shown resident in main storage 54 is a typical software configuration for computer 50, including an operating system 66 (which may include various components such as kernels, device drivers, runtime libraries, etc.) accessible by one or more applications 68.

Computer 50, or any subset of components therein, may also be referred to hereinafter as an "apparatus". It should be recognized that the term "apparatus" may be considered to incorporate various data processing systems such as computers and other electronic devices, as well as various components within such systems, including individual integrated circuit devices or combinations thereof. Moreover, within an apparatus may be incorporated one or more circuit arrangements, typically implemented on one or more integrated circuit devices, and optionally including additional discrete components interfaced therewith.

It should also be recognized that circuit arrangements are typically designed and fabricated at least in part using one or more computer data files, referred to herein as hardware definition programs, that define the layout of the circuit arrangements on integrated circuit devices. The programs are typically generated in a known manner by a design tool and are subsequently used during manufacturing to create the layout masks that define the circuit arrangements applied to a semiconductor wafer. Typically, the programs are provided in a predefined format using a hardware definition language (HDL) such as VHDL, Verilog, EDIF, etc. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of computer readable signal bearing media used to actually carry out the distribution. Examples of computer readable signal bearing media include but are not limited to recordable type media such as volatile and non-volatile memory devices, floppy disks, hard disk drives, CD-ROM's, and DVD's, among others, and transmission type media such as digital and analog communications links.

Figure 2:
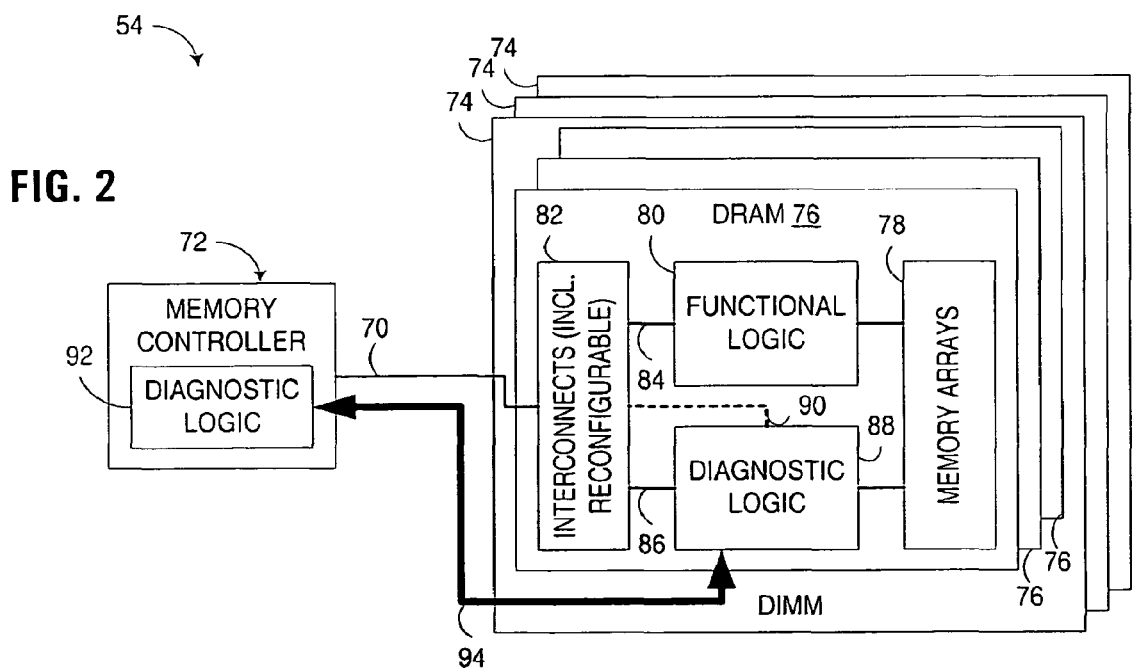
FIG. 2 is a block diagram an exemplary implementation of the main storage in the apparatus of FIG. 1.

FIG. 2 next illustrates an exemplary architecture for main storage 54, including a memory bus 70 coupling together a memory controller 72 with a plurality of memory modules (e.g., Dual Inline Memory Modules, or DIMM's) 74. Each memory module 74 is typically implemented using a printed circuit board or card upon which is disposed a plurality of dynamic random access memory (DRAM) memory devices 76, and optionally additional interface circuitry. For example, in a DDR2 SDRAM environment, each memory module may include a redrive device (not shown) that redrives the address and control lines from memory bus 70 to each memory device.

As another example, in a fully buffered DIMM (FB-DIMM) environment, memory modules 74 may be coupled to one another in a daisy chain arrangement, and each memory module may incorporate an Advanced Memory Buffer (AMB) device suitable for redriving the data, address and control lines from the memory bus to each memory device, as well as to drive subsequent FB-DIMM memory modules in the daisy chain arrangement consistent with the FB-DIMM specification.

In addition, each DRAM 76 includes one or more memory arrays 78, which are controlled by functional logic 80 to write data to each memory array, read data stored in each memory array, and perform other functions conventional to a DRAM memory device, as is well known to those skilled in the art. It will be appreciated that the functional logic may vary in different implementations, typically based upon the particular memory device standard to which DRAM 76 conforms.

To interconnect DRAM 76 to memory bus 70, a plurality of interconnects are used, as illustrated at 82. At least a portion of these interconnects are functional interconnects over which information is communicated during the normal operation of the DRAM, and which is communicated to and from functional logic 80 over a functional interface 84. Moreover, in the illustrated embodiment, at least a subset of these functional interconnects are dynamically reconfigurable to operate in a diagnostic mode, and provide a diagnostic interface 86 for use by diagnostic logic 88. Diagnostic interface 86 may include multiple diagnostic interfaces, e.g., two diagnostic interfaces in the illustrated embodiment. Moreover, each diagnostic interface may be routed through dynamically reconfigurable functional interconnects, dedicated interconnects, or combinations of the same. For dynamically reconfigurable functional interconnects, diagnostic logic 88 typically drives at least one mode select signal 90 to select the proper mode for each such functional interconnect.

Memory controller 72 may be a dedicated device, or alternatively, may be incorporated into a composite device, e.g., including one or more embedded caches and/or one or more cache controllers used to drive an external cache. Memory controller 72 may also be combined with other "chipset"-related components, e.g., system I/O components, PCI interface components, etc. Furthermore, memory controller 72 may be embedded in a processor device in some implementations.

Incorporated into memory controller 72 is complementary diagnostic logic 92, which is coupled to memory bus 70 so as to communicate with diagnostic logic 88 on each DRAM 76 via the appropriate diagnostic interface(s). As represented by arrow 94, when properly configured, diagnostic logic blocks 88, 92 are permitted to communicate with one another via a subset of interconnects 82 and memory bus 70 when a diagnostic mode is enabled on each DRAM 76. In this regard, it will be appreciated that arrow 94 is merely representative of the communications pathway between blocks 88 and 92, rather than being a separate physical pathway.

The manners in which a diagnostic mode may be selected may vary in different embodiments. For example, it may be desirable to configure a memory device to start out in a diagnostic mode with a diagnostic interface enabled to allow for various diagnostic operations such as wire test, ABIST, LBIST, etc. to be performed during device initialization. It may also be desirable, as noted below, to enable a diagnostic mode to be selected in response to a command, e.g., via assertion of particular control signals, or communication of a particular command over the memory bus (e.g., a MRS or EMRS command as supported by the DDR2 SDRAM standard). It may also be desirable to enable a diagnostic mode to be selected in response to a detected error.

Likewise, various manners of switching from a diagnostic mode to a functional mode may be used consistent with the invention. For example, it may be desirable to support specific commands (e.g., JTAG commands) to disable a diagnostic interface. It may also be desirable to disable such an interface in response to expiration of a timer, detection of inactivity over the interface, detection of activity over a functional interface (e.g., the starting of clocks), etc.

It will be appreciated that practically any memory architecture may be utilized in connection with the invention. Moreover, it will be appreciated that a diagnostic interface may be implemented at different levels in a memory hierarchy. For example, diagnostic logic may be utilized in other components than DRAM memory devices and memory controllers, e.g., at a module level, a card level, a subsystem level, a system level, etc. Diagnostic logic may be disposed, for example, in a processor, a memory controller, a DIMM or other memory module controller, a buffer/redrive device (e.g., for an FB-DIMM module), or practically any device capable of coupling to the interconnects of a memory device. As such, the invention is not limited to the particular memory architectures described specifically herein.

FIGS. 3-9 next illustrate a specific embodiment of the invention in a DDR2 SDRAM environment, where two JTAG-based diagnostic interfaces (designated JTAG0 and JTAG1 interfaces) are defined using two sets of dynamically reconfigurable functional interconnects. In this specific embodiment, the power up state of the DRAM has the JTAG0 interface enabled and the JTAG1 interface disabled. If the memory device and all connections to it are working correctly, a series of test operations that insure all the pins work, and the internal arrays pass a deterministic set of test patterns, are initiated by the JTAG0 interface. A full JTAG test scan may be performed, or only a subset of JTAG scanning may be used. Furthermore, the 5 pins used for JTAG are tested to insure they work correctly by requiring a sufficiently diverse pattern of commands and data patterns to be communicated over the interface. If an error exists on one of the other pins (e.g., as found with a wire test), then conventional schemes to allow for the replacement of those defective lines may be employed (e.g., using a redundant pin or steering the defect path out and time sharing it with other good lines in a degraded performance mode until such a time that the defective element can be repaired, or running in degraded mode indefinitely). If defective array elements are found, they may be repaired by swapping in redundant elements on the device (spare bit lines, spare word lines, or larger spare segments if they are available). Furthermore, at a system level, array defects may also be spared out with redundant devices specifically architected in the structure for that purpose.

If a defect exists on one of the default JTAG interface pins, a signature unique from those described would typically exist. In such a case, the default TCK may be stopped and the alternate diagnostic interface may be enabled by use of it's TCK. Any error discovered on one of those pins may then be addressed in a similar manner as described above (e.g., using a redundant element, time sharing a bad pin with a good pin in degraded mode, etc.)

In addition, in the embodiment described hereinafter, it may be desirable to support entry into diagnostic mode using a MRS/EMRS command, with a return to normal operation enabled via a JTAG command, a time out on the interface, a time out on TCK activity, or in another suitable manner. Even where a device has stored data therein, it still may be desirable to isolate and potentially repair errors that are detected after power up initialization. In some instances, conventional array testing may be avoided, given that ECC may be used in some instances to address many types of failures. Further given that failures from multiple devices are usually not likely to line up, conventional redundancy and redundant bit steering may also be used to address such issues.

Further, another benefit of supporting a dynamic switch to diagnostic mode after normal operation is the ability to permit interfaces to the memory devices to be comprehensively checked out, and to permit command/address redundancy in the hierarchy or the invocation of cripple modes to be used to repair defects that would otherwise bring a system down. Deferred repair actions may also be used to restore a system to full performance later in time.

Further, as noted above it may also be desirable to support entry into diagnostic mode in response to detection of any number of errors. In doing so, a memory device may be required to first put itself into self refresh so that array contents are not lost. Typical types of errors that may be detected may include command/address parity error, illegal commands, illegal command timings (e.g., back to back row commands, column reads or writes without open rows, row open commands to already open banks, normal commands before refreshes complete, etc.), refresh time outs, DLL's out of synchronization, thermal faults, etc. Various methods of reporting errors may be used, e.g., signaling an error with a strobe line.

It will be appreciated that a problem that only affects one DRAM typically may be corrected with traditional ECC and redundancy schemes. An exit JTAG and ignore error command, for example, may be supported to reactivate the device. If multiple DRAM's detect an error at the same time (as could be the case with address parity, illegal command, etc.), then it may be desirable to support the capability to put any remaining devices in self refresh or allow a time out to put them in self refresh and enable diagnostic mode to determine the extent of the fault and initiate any possible repair.

Figure 3:
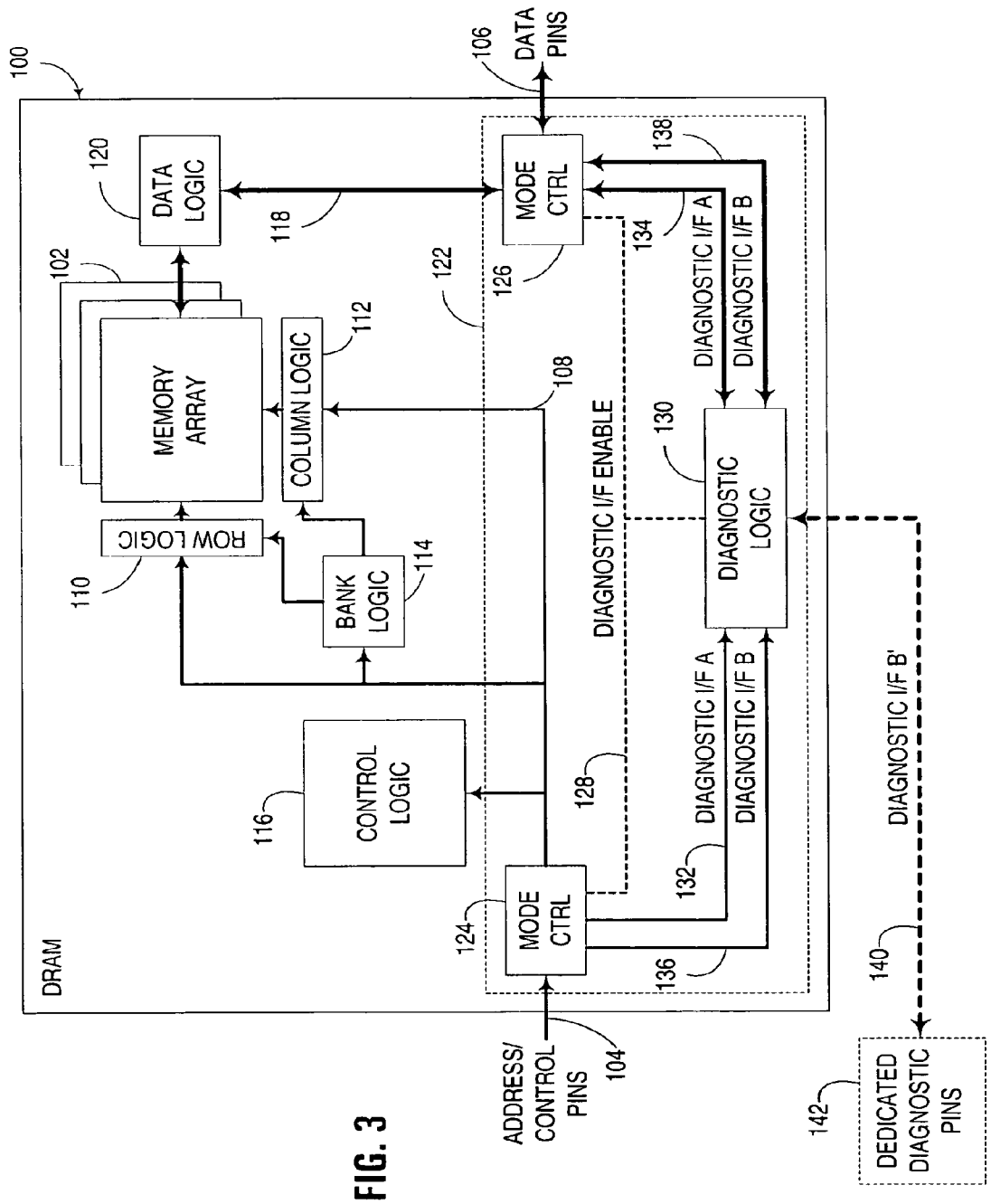
FIG. 3 is a block diagram of an exemplary implementation of one of the DRAM memory devices in the memory architecture of FIG. 2.

Turning now to FIG. 3, an exemplary implementation of a DDR2 SDRAM memory device 100 is illustrated in greater detail. Consistent with the DDR2 SDRAM standard, memory device 100 includes one or more memory arrays 102, as well as a set of address/control pins 104 and data pins 106. Address/control pins, in a conventional memory device, are routed via an internal bus 108 to a row logic block 110, column logic block 112, bank logic block 114 and control logic block 116, and data pins 106 are coupled to an internal data bus 118, which is further coupled to a data logic block 120. Each of blocks 110, 112, 114, 116 and 120 generally represent conventional functional logic within a DDR2 SDRAM device, and as such, the configuration and use thereof is apparent to one of ordinary skill in the art having the benefit of the instant disclosure, and is fully consistent with the DDR2 SDRAM specification.

Consistent with the invention, however, memory device 100 additionally includes a diagnostic circuit 122 that supports the addition of one or more diagnostic interfaces to memory device 100. In particular, diagnostic circuit 122 includes a pair of mode control blocks 124, 126, respectively coupled between address/control pins 104 and internal bus 108, and data pins 106 and internal data bus 118. Each mode control block 124, 126 renders one or more of the pins 104, 106 as dynamically reconfigurable functional pins. In particular, each block 124, 126 is responsive to one or more diagnostic interface enable signals 128 provided by a diagnostic logic block 130 to selectively disconnect one or more such functional pins 104, 106 from the respective internal buses 108, 118. When configured in a diagnostic mode, one or more of such pins 104, 106 are electrically coupled to diagnostic logic block 130 via a signal path defining a diagnostic interface.

For example, in the implementation illustrated in FIG. 3, a pair of diagnostic interfaces, designated as diagnostic interfaces "A" and "B" are defined. Diagnostic interface "A" is coupled to a plurality of address/control pins 104 via a set of interconnects 132, and to one or more data pins 106 via a set of interconnects 134. Likewise, to support a secondary or slave diagnostic interface, memory device 100 is shown incorporating second sets of interconnects 136, 138, which are respectively coupled to selected pins 104, 106 via mode control blocks 124, 126. Furthermore, in alternate embodiments of the invention, one or more dedicated diagnostic interfaces may be supported. For example, in lieu of or in addition to a secondary diagnostic interface such as diagnostic interface "B," a diagnostic interface B☐, incorporating a set of interconnects 140, may be coupled to diagnostic logic block 130 and routed to a set of dedicated diagnostic pins illustrated at 142. As noted above, it will be appreciated that as few as one, or any combination of multiple diagnostic interfaces, may be utilized consistent with the invention.

The manner in which mode control blocks 124, 126 selectively and electrically couple selected pins to specific signal paths in a functional or diagnostic interface may vary in different implementations. For example, any number of selector circuits that select between multiple paths, such as multiplexer circuits, steering circuits, pass gate logic circuits, etc., may be used to implement each block 124, 126. Other mechanisms for selectively reconfiguring a functional interconnect between functional and diagnostic modes will be apparent to one of ordinary skill in the art having the benefit of the instant disclosure.

Diagnostic logic block 130 may incorporate any number of diagnostic-related functions, including, for example, various ABIST and LBIST circuits, various scan chain circuits, various error corrections circuits, various error detection circuits, various interface test circuits, various clock check circuits, various DLL check circuits, various interface parity check circuits, various ECC circuits, etc. It will be appreciated that, based upon the herein-described diagnostic interface architecture, practically any type of diagnostic or test-related functionality may be implemented in a memory device consistent with the invention.

Figure 4:
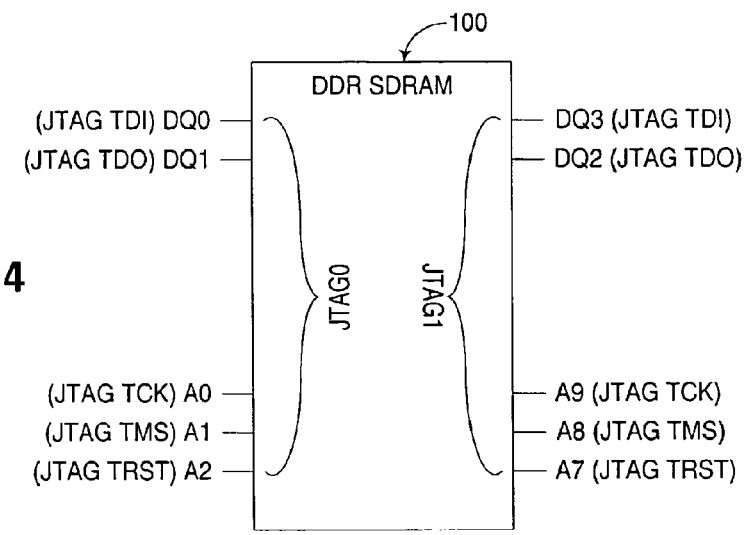
FIG. 4 is a block diagram of an exemplary mapping of dynamically reconfigurable functional interconnects to primary and secondary diagnostic interfaces in a DDR SDRAM implementation of the DRAM memory device of FIG. 3.

One suitable mapping of two JTAG-based diagnostic interfaces to a DDR2 SDRAM memory device functional interface is illustrated in FIG. 4. In particular, it may be desirable to utilize two sets of five pins on memory device 100 to implement the desired diagnostic interfaces without the need to add any pins to the memory device. While a multitude of alternatively mappings may be used, one suitable mapping would utilize, for the JTAG0 diagnostic interface, data I/O pins DQ0 and DQ1 for the JTAG scan in (TDI) and scan out (TDO) interconnects, with address pins A0 A2 used for the JTAG control set (TCK, TMS and TRST). For JTAG1, data I/O pins DQ2 and DQ3, along with address pins A7-A9, may serve a similar purpose. It should be noted that pins such as DQ0-DQ3 are readily suited for scan in/scan out as they are typically unique per DRAM and have both driver and receiver present on each pin.

Figure 5A:
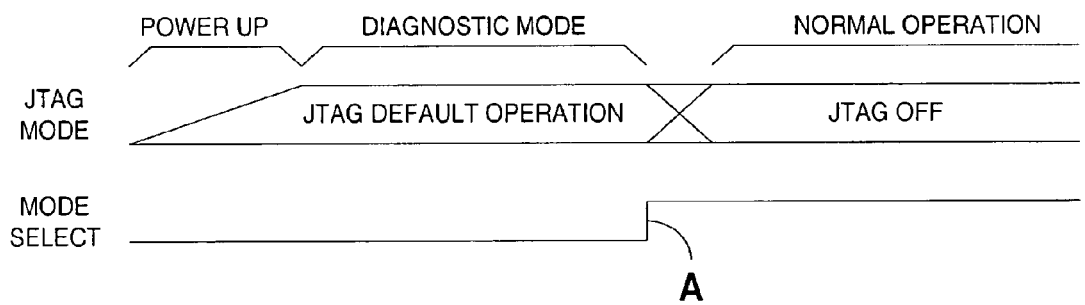
FIG. 5A is a timing diagram illustrating a power up sequence for the memory device of FIG. 4.
Figure 5B:
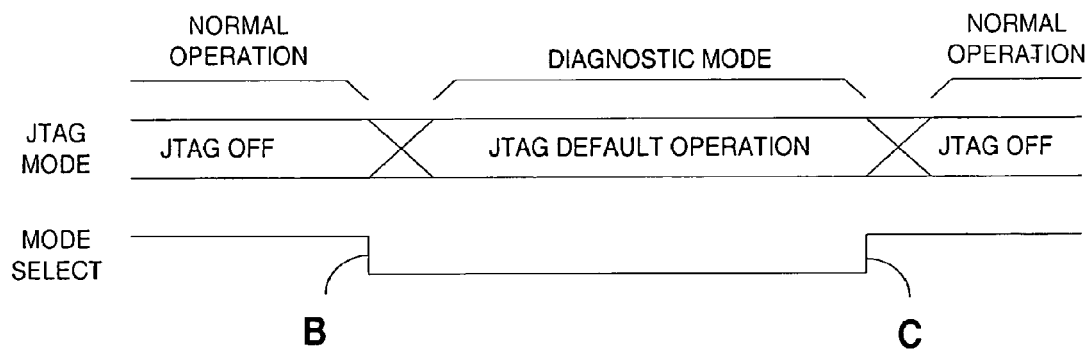
FIG. 5B is a timing diagram illustrating a diagnostic mode switch sequence for the memory device of FIG. 4.

FIGS. 5A and 5B are timing diagrams illustrating the dynamic reconfiguration of functional interconnects to selectively enable a diagnostic interface in memory device 100. FIG. 5A, in particular, illustrates a power on sequence whereby after a power up phase, a mode select signal initially defaults the memory device to a "JTAG" or diagnostic mode during which JTAG operations may be performed. Upon completion of a series of JTAG default operations occurring during initialization, the mode select signal is transitioned as illustrated at A to dynamically reconfigure the functional interconnects to a normal mode of operation, whereby JTAG operations are disabled and conventional operation of the memory device can proceed.

FIG. 5B similarly illustrates a sequence of operations utilized in connection with dynamically switching to a JTAG mode during the normal operation of the memory device. In particular, the dynamic switch to a diagnostic mode is illustrated via the transition of the mode select signal at point B, whereby a diagnostic mode is enabled, and JTAG operations may be performed. Upon completion of the JTAG operations, the mode select signal may be transitioned at point C to return the memory device to normal operation.

It will be appreciated that the transition from a diagnostic mode to a normal mode of operation (illustrated at A and C in FIGS. 5A and 5B) may occur in a number of manners consistent with the invention, e.g., a JTAG command, expiration of a timer, detection of inactivity, or in other manners that will be apparent to one of ordinary skill in the art having the benefit of the instant disclosure. Similarly, a transition to a diagnostic mode may occur in a number of manners, including via default start up operation, as illustrated in FIG. 5A, as well as receipt of a command, detection of an error, etc. Other manners of initiating a diagnostic mode may be used consistent with the invention.

Figure 6:
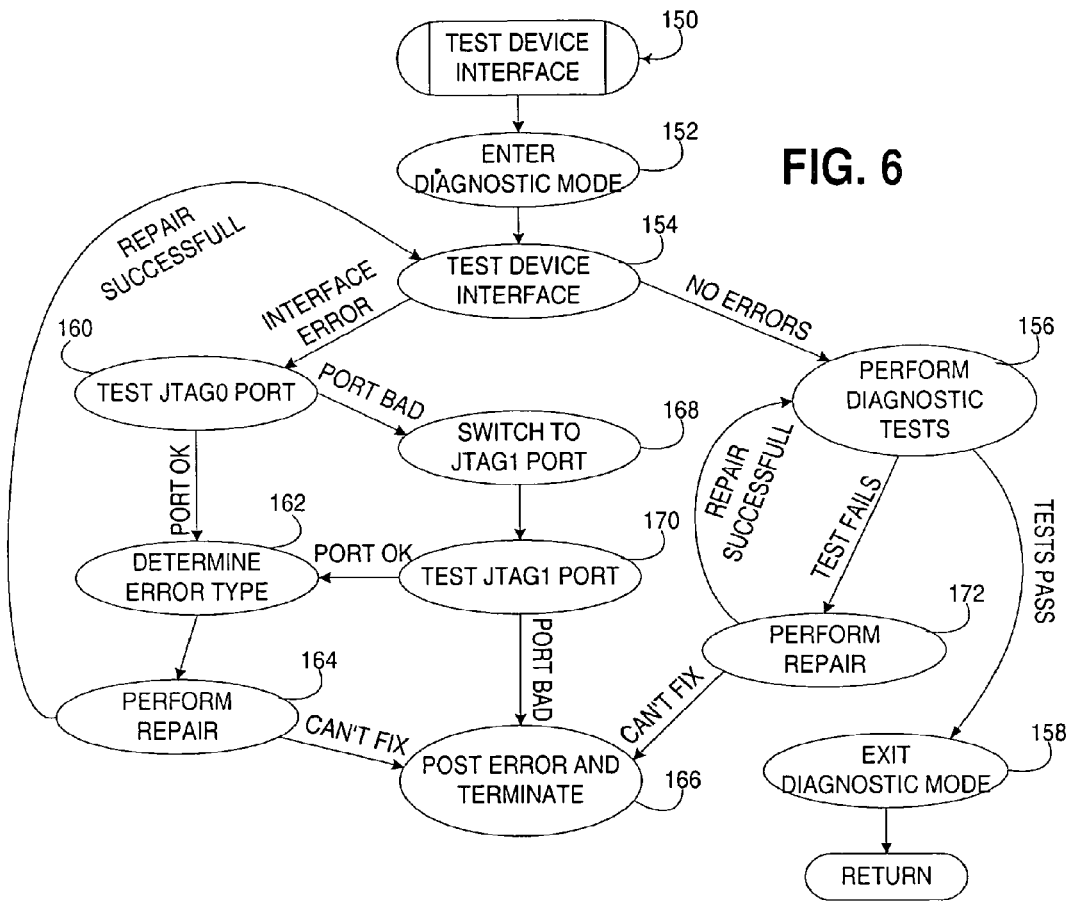
FIG. 6 is a flowchart illustrating an exemplary sequence of steps utilized in testing the device interface for the memory device of FIG. 4.

FIG. 6 next illustrates a flowchart of an exemplary sequence of steps utilized in testing the device interface for the memory device of FIG. 4. This sequence of steps, illustrated at 150, begins at block 152 by entering a diagnostic mode, under which the first diagnostic interface (JTAG0) is enabled. Next, the device interface is tested at 154 to attempt to determine if any errors exist in the device interface. Such testing may include, for example, connectivity checks, short checks, timing checks, leakage checks, and/or other tests related to the proper operation of the device interface itself.

In the event no errors are detected, control passes to block 156 to perform diagnostic testing on the memory device, e.g., by performing any number of tests related to the internal operation of the memory device, rather than the device interface. For a memory device, such testing may include ABIST, LBIST, DLL checks, and other tests related to the accessibility and proper operation of the various memory locations in the device. In the event that all diagnostic tests are passed, control normally proceeds to block 158 to exit the diagnostic mode and return the memory device to a normal operational state with the dynamically reconfigurable functional interconnects enabled for use in normal operation. The sequence of steps in then complete.

Returning to block 154, if the test of the device interface detects an error in the interface, control passes to block 160 to test the JTAG0 port or interface, e.g., by attempting to write and read test data to and from the port to verify its proper operation. In the event that the JTAG0 port passes the test, control passes to block 162 to determine the error type on the interface. The types of errors that may be detected include, for example, open lines, shorted lines, timing errors, etc. Next, block 164 attempts to perform a repair based upon the detected error type. If it is possible to perform the repair, and the repair is successful, control passes to block 154 to retest the device interface. Otherwise, if the repair cannot be fixed block 164 passes control to block 166 to post an error and terminate the test. By doing so, the memory device will be marked as FAILED, typically in an error log, and a system administrator notified that a manual repair needs to be performed.

Returning again to block 160, if the test of the JTAG0 port detects the port is bad, a transition occurs to block 168 to switch to the JTAG1 port, thus enabling the secondary or alternate diagnostic interface for the memory device. Control then passes to block 170 to test the JTAG1 port, typically using the same testing algorithm utilized in block 160. If the port has no errors itself, control passes to block 162 to attempt to determine the error type on the interface and perform the repair. Otherwise, if the port is bad, block 170 passes control directly to block 166 to post an error and termination operation.

Returning to block 156, if, after the test device has been determined to include no errors in block 154, and diagnostic tests are performed on the memory device in block 156, a failure of any test results in block 156 passing control to block 172 to attempt to perform a repair. The types of repairs that may be performed include, for example, invoking embedded redundant circuitry provided in a device, e.g., redundant memory cells, sense amplifiers, restore circuits, decoders, bit lines, word lines, etc. f the repair is successful, control returns to block 156 to perform additional diagnostic tests. Otherwise, if the repair cannot be performed, block 172 passes control to block 166 to post an error and terminate operation.

Figures 7, 8, 9:
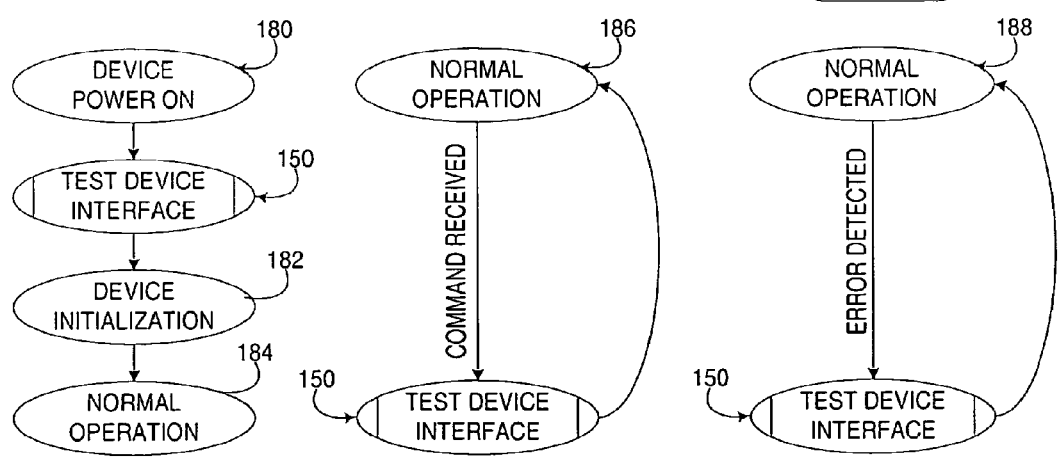
FIG. 7 is a flowchart illustrating an exemplary power up entry to the sequence of FIG. 6.
FIG. 8 is a flowchart illustrating an exemplary command initiated entry to the sequence of FIG. 6.
FIG. 9 is a flowchart illustrating an exemplary error initiated entry to the sequence of FIG. 6.

The sequence of steps illustrated in FIG. 6 may have a number entry points, as mentioned above. FIG. 7, for example, illustrates at 180 an entry point occurring during device power on. During device power on, it may be desirable to initialize the memory device to a diagnostic mode, with the primary diagnostic interface, JTAG0 port enabled. As such, the sequence of steps illustrated at 150 may be initially performed during device power on. Upon completion of this sequence of steps, and upon detecting no errors the device is transitioned to a normal operational mode. Normal device initialization may then be performed at block 182, followed by a transition to a normal operational mode, as illustrated at block 184.

In addition, as illustrated at block 186 in FIG. 8, a device interface test may be performed dynamically during normal operation of the memory device, e.g., in response to a command being received over the memory interface, with the device being returned to normal operation upon completion of the sequence of steps illustrated at 150. As noted above, various commands may be utilized to transition a memory device to a diagnostic mode, e.g., an MRS/EMRS command.

Likewise, FIG. 9 illustrates at 188 a transition from normal operation to a diagnostic mode via detection of an error on the memory device, as well as the transition back to normal operation upon completion of the sequence of steps illustrated at 150. Detection of an error may occur through a number of mechanisms consistent with the invention, e.g., parity checks, ECC checks, PLL/DLL lock checks, timing rule violation checks, illegal sequence checks, refresh checks, etc.

It will be appreciated that various modifications may be made to the illustrated embodiments consistent with the invention. It will also be appreciated that implementation of the functionality described above, and in particular, of the specific sequence of operations illustrated in FIGS. 6-9, and of the various diagnostic tests that may be performed over a diagnostic interface consistent with the invention, within diagnostic logic disposed on a memory device, a memory controller, and/or other control logic in a memory architecture, would be well within the abilities of one of ordinary skill in the art having the benefit of the instant disclosure.

Additional modifications to the illustrated embodiments may be made without departing from the spirit and scope of the invention. Therefore the invention lies in the claims hereinafter appended.

What is claimed is:

1. A circuit arrangement, comprising:
   a memory device coupled to a memory interface including a plurality of functional interconnects utilized in reading data from the memory device and writing data to the memory device; and
   control logic coupled to the memory device and configured to perform a diagnostic operation on the memory device by:
   enabling a diagnostic interface on the memory device by dynamically reconfiguring a subset of the functional interconnects to operate in a diagnostic mode, including changing a function of a first functional interconnect from the subset of functional interconnects that communicates address or data information to communicate control information when in the diagnostic mode;
   communicating diagnostic information over the diagnostic interface while the subset of functional interconnects are in the diagnostic mode; and
   disabling the diagnostic interface by dynamically reconfiguring the subset of the functional interconnects to operate in a functional mode, wherein disabling the diagnostic interface is performed in response to at least one of a command received over the diagnostic interface, expiration of a timer, a detection of inactivity on the diagnostic interface, and starting a clock.

2. The circuit arrangement of claim 1, wherein the subset of functional interconnects are dedicated to diagnostic operations when configured to operate in the diagnostic mode.

3. The circuit arrangement of claim 1, wherein each dynamically reconfigurable functional interconnect is selected from the group consisting of an address interconnect, a data interconnect, a command interconnect, a control interconnect, a clock interconnect, a strobe interconnect, and combinations thereof.

4. The circuit arrangement of claim 1, further comprising a second diagnostic interface coupled to the memory device and configured for use in performing diagnostic operations if a failure exists in the first diagnostic interface.

5. The circuit arrangement of claim 1, wherein the diagnostic interface comprises a test scan interface.

6. The circuit arrangement of claim 5, wherein the diagnostic interface comprises a JTAG interface.

7. The circuit arrangement of claim 1, wherein the diagnostic interface is configured to configure each of the dynamically reconfigurable functional interconnects to operate in the diagnostic mode upon initial power up.

8. The circuit arrangement of claim 1, wherein the diagnostic interface is configured to configure each of the dynamically reconfigurable functional interconnects to operate in the diagnostic mode in response to a command received over the memory interface.

9. The circuit arrangement of claim 1, wherein the diagnostic interface is configured to configure each of the dynamically reconfigurable functional interconnects to operate in the diagnostic mode in response to a detected error.

10. The circuit arrangement of claim 1, wherein the diagnostic interface is configured to configure each of the dynamically reconfigurable functional interconnects to switch from the diagnostic mode to a functional mode in response to a command received over the diagnostic interface.

11. The circuit arrangement of claim 1, wherein the diagnostic interface is configured to configure each of the dynamically reconfigurable functional interconnects to switch from the diagnostic mode to a functional mode in response to expiration of a timer.

12. The circuit arrangement of claim 1, wherein the diagnostic interface is configured to configure each of the dynamically reconfigurable functional interconnects to switch from the diagnostic mode to a functional mode in response to a detection of inactivity on the diagnostic interface.

13. The circuit arrangement of claim 1, wherein the diagnostic interface is configured to configure each of the dynamically reconfigurable functional interconnects to switch from the diagnostic mode to a functional mode in response to starting a clock.

14. The circuit arrangement of claim 1, wherein the memory interface is dedicated to the memory device.

15. The circuit arrangement of claim 1, further comprising a second memory device, wherein the memory interface is configured is shared by the first and second memory devices.

16. The circuit arrangement of claim 1, wherein at least a portion of the control logic is disposed in a memory controller coupled to the memory device.

17. The circuit arrangement of claim 1, wherein at least a portion of the control logic is disposed in the memory device.

18. An apparatus comprising the circuit arrangement of claim 1.

19. An integrated circuit device comprising the circuit arrangement of claim 1.

20. An apparatus, comprising:
a memory device;
a memory interface coupled to the memory device and including a plurality of functional interconnects utilized in reading data from the memory device and writing data to the memory device; and
a memory controller coupled to the memory device over the memory interface and configured to perform a diagnostic operation on the memory device by:
enabling a diagnostic interface on the memory device by dynamically reconfiguring a subset of the functional interconnects to operate in a diagnostic mode, including changing a function of a first functional interconnect from the subset of functional interconnects that communicates address or data information to communicate control information when in the diagnostic mode;
communicating diagnostic information over the diagnostic interface while the subset of functional interconnects are in the diagnostic mode; and
disabling the diagnostic interface by dynamically reconfiguring the subset of the functional interconnects to operate in a functional mode, wherein disabling the diagnostic interface is performed in response to at least one of a command received over the diagnostic interface, expiration of a timer, a detection of inactivity on the diagnostic interface, and starting a clock.

* * * * *